United States Patent
Nishimura et al.

(10) Patent No.: US 9,245,764 B2
(45) Date of Patent: Jan. 26, 2016

(54) SEMICONDUCTOR DEVICE MANUFACTURING METHOD

(71) Applicant: TOKYO ELECTRON LIMITED, Tokyo (JP)

(72) Inventors: Eiichi Nishimura, Miyagi (JP); Tadashi Kotsugi, Miyagi (JP); Fumiko Yamashita, Miyagi (JP); Kenji Adachi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/356,809

(22) PCT Filed: Nov. 16, 2012

(86) PCT No.: PCT/JP2012/007360
§ 371 (c)(1),
(2) Date: May 7, 2014

(87) PCT Pub. No.: WO2013/073193
PCT Pub. Date: May 23, 2013

(65) Prior Publication Data
US 2015/0079790 A1 Mar. 19, 2015

Related U.S. Application Data

(60) Provisional application No. 61/567,667, filed on Dec. 7, 2011.

(30) Foreign Application Priority Data

Nov. 17, 2011 (JP) ................................ 2011-251397

(51) Int. Cl.
*H01L 21/311* (2006.01)
*H01L 21/308* (2006.01)
(Continued)

(52) U.S. Cl.
CPC ....... *H01L 21/3088* (2013.01); *H01J 37/32091* (2013.01); *H01L 21/0337* (2013.01);
(Continued)

(58) Field of Classification Search
CPC ............ H01L 21/3065; H01L 21/3083; H01L 21/3081
USPC ............................................. 438/696; 216/46
See application file for complete search history.

(56) References Cited

U.S. PATENT DOCUMENTS

2006/0175292 A1 8/2006 Hanewald et al.

FOREIGN PATENT DOCUMENTS

| JP | 2002-542623 A | 12/2002 |
|----|---------------|---------|
| JP | 2003-31557 A  | 1/2003  |
| JP | 2003-37100 A  | 2/2003  |
| JP | 2008-103718 A | 5/2008  |
| JP | 2008-277857 A | 11/2008 |

(Continued)

OTHER PUBLICATIONS

International Search Report mailed Feb. 12, 2013 in PCT/JP2012/007360.

*Primary Examiner* — Roberts Culbert
(74) *Attorney, Agent, or Firm* — Rothwell, Figg, Ernst & Manbeck, P.C.

(57) ABSTRACT

This semiconductor device manufacturing method is provided with: a film-forming step wherein a silicon nitride layer or a silicon oxide layer is formed such that a side wall portion of a silicon-containing layer, which is formed on a substrate and patterned, is covered with the silicon nitride layer or the silicon oxide layer; and a plasma etching step wherein the silicon-containing layer is selectively removed, and the silicon nitride layer or the silicon oxide layer formed on the side wall portion is left. In the plasma etching step, an etching gas containing $SF_6$ gas is used.

11 Claims, 4 Drawing Sheets

(51) Int. Cl.
*H01L 21/033* (2006.01)
*H01L 21/3213* (2006.01)
*H01J 37/32* (2006.01)
*H01L 21/3065* (2006.01)

(52) U.S. Cl.
CPC ........ *H01L21/3065* (2013.01); *H01L 21/3081* (2013.01); *H01L 21/3083* (2013.01); *H01L 21/32137* (2013.01)

(56) References Cited

FOREIGN PATENT DOCUMENTS

| | | |
|---|---|---|
| JP | 2009-514192 A | 4/2009 |
| JP | 2009-193989 A | 8/2009 |
| JP | 2010-114424 A | 5/2010 |
| JP | 2011-527839 A | 11/2011 |
| WO | 00/63960 A1 | 10/2000 |
| WO | 2010/014380 A2 | 2/2010 |

SEMICONDUCTOR DEVICE MANUFACTURING METHOD

CROSS REFERENCE TO RELATED APPLICATION

This application is a 35 U.S.C. 371 National Phase Entry Application from PCT/JP2012/007360, filed Nov. 16, 2012, which claims the benefit of U.S. Provisional Application No. 61/567,667, filed Dec. 7, 2011 and Japanese Patent Application No. 2011-251397, filed Nov. 17, 2011, the disclosures of which are incorporated herein in their entirety by reference.

TECHNICAL FIELD

The present disclosure relates to a method of manufacturing a semiconductor device.

BACKGROUND

In a process of manufacturing, for example, a semiconductor device, an etching processing such as, for example, plasma etching, has conventionally been performed on a substrate such as, for example, a semiconductor wafer to form, for example, a fine circuit pattern. In such an etching process, formation of a mask has been performed through a photolithography process using a photoresist.

In the photolithography process, in order to cope with miniaturization of the formed pattern, various technologies have been developed. As one of them, there is so-called double patterning. In the double patterning, patterning is performed in two stages which includes a first patterning step for forming a first pattern, and a second patterning step for forming a second pattern after the first patterning step so as to form a mask with a more fine interval than a mask formed by single patterning (see, e.g., Patent Document 1).

As such a double patterning technology, a so called side wall transfer technology is known in which a layer containing silicon such as, for example, amorphous silicon, is patterned into a predetermined pattern (e.g., a line and space pattern), a film such as, for example, a silicon oxide layer or a silicon nitride layer, is formed on the side wall portion of the pattern of the silicon-containing layer, and then, the pattern of the silicon-containing layer surrounded by the film is removed through etching so that the silicon oxide layer or the silicon nitride film layer formed on the side wall portion of the pattern of the silicon is left. In such a double patterning technology, the silicon-containing layer surrounded by, for example, the silicon oxide layer or the silicon nitride layer, has conventionally been removed by plasma etching using a gas system such as, for example, HBr or $Cl_2$.

PRIOR ART DOCUMENT

Patent Document

Patent Document 1: Japanese Patent Laid-Open Publication No. 2008-103718

DISCLOSURE OF THE INVENTION

Problems to be Solved

The double patterning technology in which the silicon-containing layer surrounded by, for example, the silicon oxide layer or the silicon nitride layer, is removed through plasma etching using the gas system such as, for example, HBr or $Cl_2$ has the following problems. That is, when the silicon is removed under a plasma etching condition of a high selection ratio, the silicon-containing layer is not completely removed since residues of the silicon-containing layer are left between the silicon oxide layers or the silicon nitride layers. Meanwhile, when the silicon-containing layer is removed under a plasma etching condition of a low selection ratio, the silicon-containing layer is completely removed but a silicon oxide layer or a silicon nitride layer of an underlayer film of the silicon-containing layer is etched so that damage to the underlayer film is caused.

The present disclosure has been made to cope with the prior problems, and an object of the present disclosure is to provide a semiconductor device manufacturing method in which a silicon-containing layer having a side wall portion formed with a silicon oxide layer or a silicon nitride layer may be removed without residues and damage to an underlayer film, and thus a high quality semiconductor device may be manufactured.

Means to Solve the Problems

According to an aspect of the present disclosure, a method of manufacturing a semiconductor device includes: forming a silicon nitride layer or a silicon oxide layer to cover a side wall portion of a patterned silicon-containing layer formed on a substrate; and selectively removing the silicon-containing layer through plasma etching so that the silicon nitride layer or the silicon oxide layer formed on the side wall portion is left. In the plasma etching, an etching gas containing a $SF_6$ gas is used.

Effect of the Invention

According to the present disclosure, a silicon-containing layer having a side wall portion formed with a silicon oxide layer or a silicon nitride layer may be removed without residues and damage to an underlayer film, and thus a high quality semiconductor device may be manufactured.

DETAILED DESCRIPTION TO EXECUTE THE INVENTION

Hereinafter, an exemplary embodiment of the present disclosure will be described with reference to drawings.

Figure 1A:
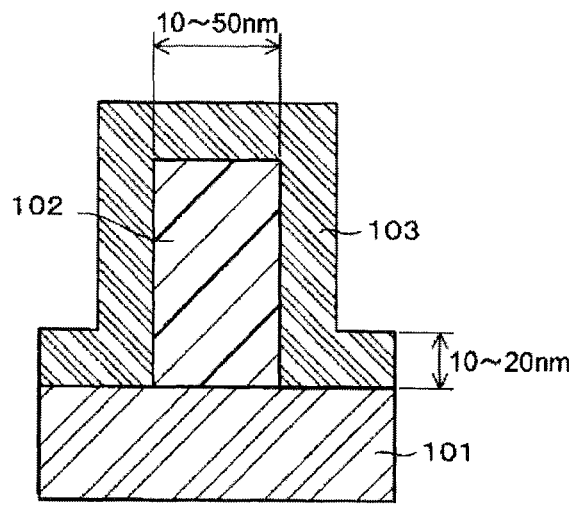
FIGS. 1A to 1C are views for explaining a manufacturing method of a semiconductor device according to an exemplary embodiment of the present disclosure.
Figure 1B:
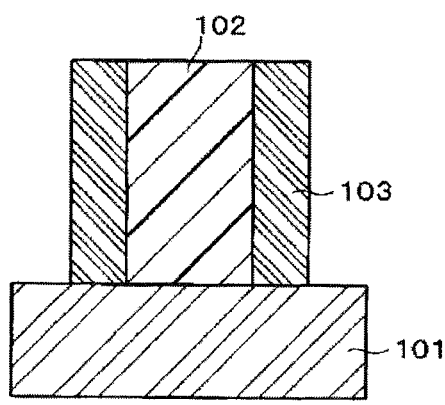
Figure 1C:
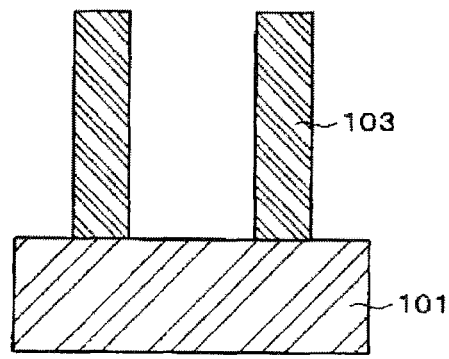

FIGS. 1A to 1C schematically illustrate a part of a semiconductor wafer W as a substrate according to an exemplary embodiment of the present disclosure in an enlarged scale, and illustrates a process of the present exemplary embodiment. As illustrated in FIG. 1A, an amorphous silicon layer 102 is formed as a silicon-containing layer patterned into a predetermined shape (a line and space in the present exemplary embodiment) on a silicon oxide layer 101 as an underlayer film.

The patterning of the amorphous silicon layer 102 is performed by, for example, an etching process which uses, for example, a mask composed of a photoresist patterned into a predetermined pattern through exposure and developing processes.

A silicon oxide layer (normal temperature oxide film) 103 is formed by, for example, atomic layer deposition (ALD) on the amorphous silicon layer 102. The width of the amorphous silicon layer 102 may range, for example, from about 10 nm to 50 nm, and the thickness of the silicon oxide layer 103 may range, for example, from about 10 nm to 20 nm.

From the state illustrated in FIG. 1A, the silicon oxide layer 103 formed on the silicon oxide layer 101 and the amorphous silicon layer 102 is removed first through etch back of the silicon oxide layer 103 formed on the surface layer to obtain the state illustrated in FIG. 1B. In this state, the silicon oxide layer 103 remains on a side wall portion of the amorphous silicon layer 102 patterned into a line shape, and the top surface of the amorphous silicon layer 102 is exposed.

Next, from the state illustrated in FIG. 1B, the amorphous silicon layer 102 having the side wall portion surrounded by the silicon oxide layer 103 is removed through selective etching to obtain the state illustrated in FIG. 1C. In this state, the silicon oxide layer 103 which has been formed on the side wall portion of the amorphous silicon layer 102 is left, and the amorphous silicon layer 102 which has been present in the central portion is removed. Accordingly, a pattern of the silicon oxide layer 103 is formed which has a narrower pitch than the amorphous silicon layer 102 which was formed in the initial stage.

The etching of the amorphous silicon layer 102 is performed by using an etching gas containing a $SF_6$ gas, that is, either a single $SF_6$ gas or a mixed gas of a $SF_6$ gas and a rare gas. As the rare gas, for example, a helium gas or an argon gas may be used.

In the above description, each of the silicon oxide layer 101 and the silicon oxide layer 103 may be a silicon nitride layer. The amorphous silicon layer 102 may be, for example, a polysilicon layer.

Hereinafter, descriptions will be made on an exemplary configuration of a plasma etching apparatus configured to perform etching of the amorphous silicon layer 102.

Figure 2:
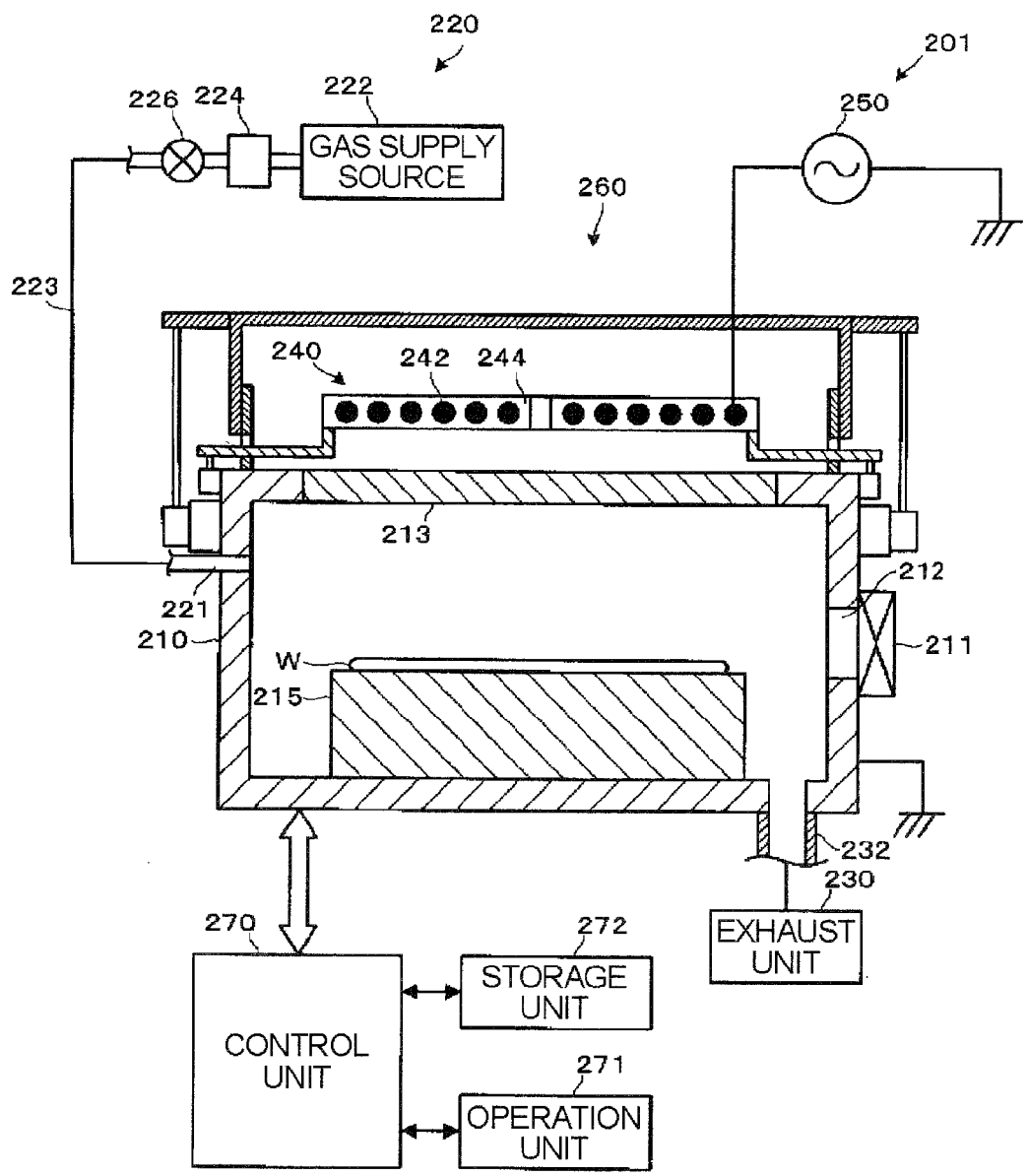
FIG. 2 is a view illustrating an exemplary configuration of a plasma etching apparatus used in the exemplary embodiment of the present disclosure.

FIG. 2 illustrates a configuration of a so-called inductively coupled plasma (ICP)-type plasma etching apparatus 201. As illustrated in FIG. 2, the plasma etching apparatus 201 is provided with a processing chamber 210. The processing chamber 210 is configured in a substantially cylindrical shape, and the surface thereof is made of, for example, anodized aluminum. A mounting unit 215 on which a substrate to be processed such as, for example, a semiconductor wafer W, is mounted is provided on a bottom portion within the processing chamber 210. For example, an electrostatic chuck (not illustrated) configured to attract the substrate to be processed is provided on a substrate mounting surface of the mounting unit 215.

A dielectric window 213 made of a dielectric substance (insulating) material such as, for example, quartz or ceramics, is provided on the ceiling portion of the processing chamber 210 to face the mounting unit 215. The dielectric window 213 is formed in a disk shape, and is provided to hermetically close a circular opening formed in the ceiling portion of the processing chamber 210.

A gas supply unit 220 configured to supply an etching gas into the processing chamber 210 is provided in the plasma etching apparatus 201. A gas introducing hole 221 is formed in the side wall portion of the processing chamber 210, and is connected to a gas supply source 222 through a gas supply pipe 223. A mass flow controller 224 configured to control a flow rate of the etching gas and an opening/closing valve 226 are interposed in the middle of the gas supply pipe 223. The etching gas from the gas supply source 222 is controlled to a predetermined flow rate by the mass flow controller 224 and supplied into the processing chamber 210 from the gas introducing hole 221.

An exhaust unit 230 configured to exhaust the inside of the processing chamber 210 is connected to the bottom portion of the processing chamber 210 through an exhaust pipe 232. The exhaust unit 230 is constituted by, for example, a vacuum pump, and is configured to decompress the inside of the processing chamber 210 to a predetermined pressure. A wafer carrying-in/out opening 212 is formed in the side wall portion of the processing chamber 210, and is provided with a gate valve 211 which is configured to be capable of being opened/closed.

Outside the ceiling portion of the processing chamber 210, a planar high frequency antenna 240 is disposed to face the outer surface (top surface) of the dielectric window 213, and a shield member 260 formed in a substantially tubular shape (a cylindrical shape in the present exemplary embodiment) is provided to cover the high frequency antenna 240. The high frequency antenna 240 is constituted by a spiral coil-type antenna element 242 made of a conductor such as, for example, copper, aluminum, or stainless steel, and the antenna element 242 is clamped between a plurality of clamping bodies 244. A high frequency power source 250 is connected to the antenna element 242. A high frequency power of a predetermined frequency, such as, for example, 13.56 MHz, 27.12 MHz, or 60 MHz, is output from the high frequency power source 250.

The plasma etching apparatus 201 is provided with a control unit 270 which is configured to control respective units of the plasma etching apparatus 201. An operation unit 271 is connected to the control unit 270 which includes, for example, a keyboard or a display. The keyboard allows an operator to perform, for example, input operation of a command so as to manage the plasma etching apparatus 201, and the display visualizes and displays the operation state of the plasma etching apparatus 201.

A storage unit 272 is connected to the control unit 270. The storage unit 272 stores, for example, programs which cause various kinds of processings to be executed in the plasma etching apparatus 201 under the control of the control unit 270, or recipes required for executing the programs.

The control unit 270 reads out a desired recipe from the storage unit 272 based on, for example, an instruction from the operation unit 271 so as to control the respective units to execute desired processings in the plasma etching apparatus 201. The recipes may be edited by the operation from the operation unit 271.

When a plasma processing on a semiconductor wafer W is performed by the plasma etching apparatus 201 configured as described above, the gate valve 211 is opened, and the semiconductor wafer W is carried into the processing chamber 210 from the wafer carrying-in/out opening 212, mounted on the mounting unit 215 and attracted by the electrostatic chuck.

Subsequently, the gate valve 211 is closed, and the inside of the processing chamber 210 is evacuated to a predetermined vacuum degree by, for example, a vacuum pump (not illustrated) of the exhaust unit 230.

Then, an etching gas containing a $SF_6$ gas at a predetermined flow rate, that is, either a single $SF_6$ gas or a mixed gas of a SF$_6$ gas and a rare gas is supplied into the processing chamber 210 by the gas supply unit 220. The pressure within the processing chamber 210 is maintained at a predetermined pressure, and a high frequency power of a predetermined frequency is applied from the high frequency power source 250 to the high frequency antenna 240. Accordingly, ICP plasma of the processing gas is generated within the processing chamber 210.

When the ICP plasma acts on the semiconductor wafer W mounted on the mounting unit 215, the plasma etching of the semiconductor wafer W is performed. Here, as required, a high frequency power for attracting ions (bias) is applied to the mounting unit 215. When a predetermined plasma etching processing is completed, the application of the high frequency power and the supply of the processing gas are stopped, and then the semiconductor wafer W is carried out from the inside of the processing chamber 210 in the reverse sequence of the above described sequence.

In Example 1, plasma etching was performed on amorphous silicon layers 102 of semiconductor wafers W in the state illustrated in FIG. 1B by using the ICP type plasma etching apparatus 201 as illustrated in FIG. 2. The plasma etching conditions are as follows.

Etching gas: SF$_6$ gas (single gas)=300 sccm
Pressure: 26.6 Pa (200 mTorr)
High frequency power: 200 W (bias 0 W)
Temperature (side wall portion/mounting unit): 70° C./60° C.
Time: 8 sec In Example 1 in which the plasma etching was performed on the amorphous silicon layers 102 under the above described plasma etching conditions, as illustrated in FIG. 1C, it was possible to remove the amorphous silicon layers 102 without residues and damage to the silicon oxide layers 101 as an underlayer film (with a high selection ratio). In this case, the etching rate of amorphous silicon was 892.9 nm/min, and the selection ratio of amorphous silicon to silicon oxide was 97.1.

When silicon nitride was used instead of silicon oxide,
the selection ratio of amorphous silicon to silicon nitride was 62.0.

When the temperature of the mounting unit was −10° C., and other etching conditions were the same as those in Example 1, the etching rate of amorphous silicon was 646.1 nm/min
the selection ratio of amorphous silicon to silicon oxide was 99.4.

When silicon nitride was used instead of silicon oxide,
the selection ratio of amorphous silicon to silicon nitride was 71.0.

As described above, when the temperature of the mounting unit was reduced, the selection ratio was on a increasing tendency, and especially, the selection ratio in relation to silicon nitride was significantly increased. Accordingly, the temperature of the mounting unit is set preferably as 60° C. or less, and more preferably as 0° C. or less.

When the high frequency power was reduced to less than 200 W to be 150 W and 100 W, and other etching conditions were the same as those in Example 1, the etching rate of amorphous silicon was reduced, and the selection ratio was on a decreasing tendency. Accordingly, it is preferable that the high frequency power is 200 W or more.

When the flow rate of an etching gas was increased from 300 sccm to be 400 sccm and 500 sccm, and other etching conditions were the same as those in Example 1, the etching rate and the selection ratio were measured. The results were as follows.

(Flow Rate of Etching Gas: 400 sccm)
Etching rate of amorphous silicon=528.4 nm/min
Selection ratio of amorphous silicon to silicon oxide=115
Selection ratio of amorphous silicon to silicon nitride=88.0
(Flow Rate of Etching Gas: 500 sccm)
Etching rate of amorphous silicon=397.6 nm/min
Selection ratio of amorphous silicon to silicon oxide=113.6
Selection ratio of amorphous silicon to silicon nitride=75.0

As described above, the selection ratio of amorphous silicon to silicon oxide and the selection ratio of amorphous silicon to silicon nitride were the highest when the flow rate of the etching gas was 400 sccm, and the selection ratio either at 300 sccm or at 500 sccm was lower than those at 400 sccm. Accordingly, the flow rate of the etching gas is preferably in the range of about 300 sccm to 500 sccm, and more preferably about 400 sccm.

Figure 3:
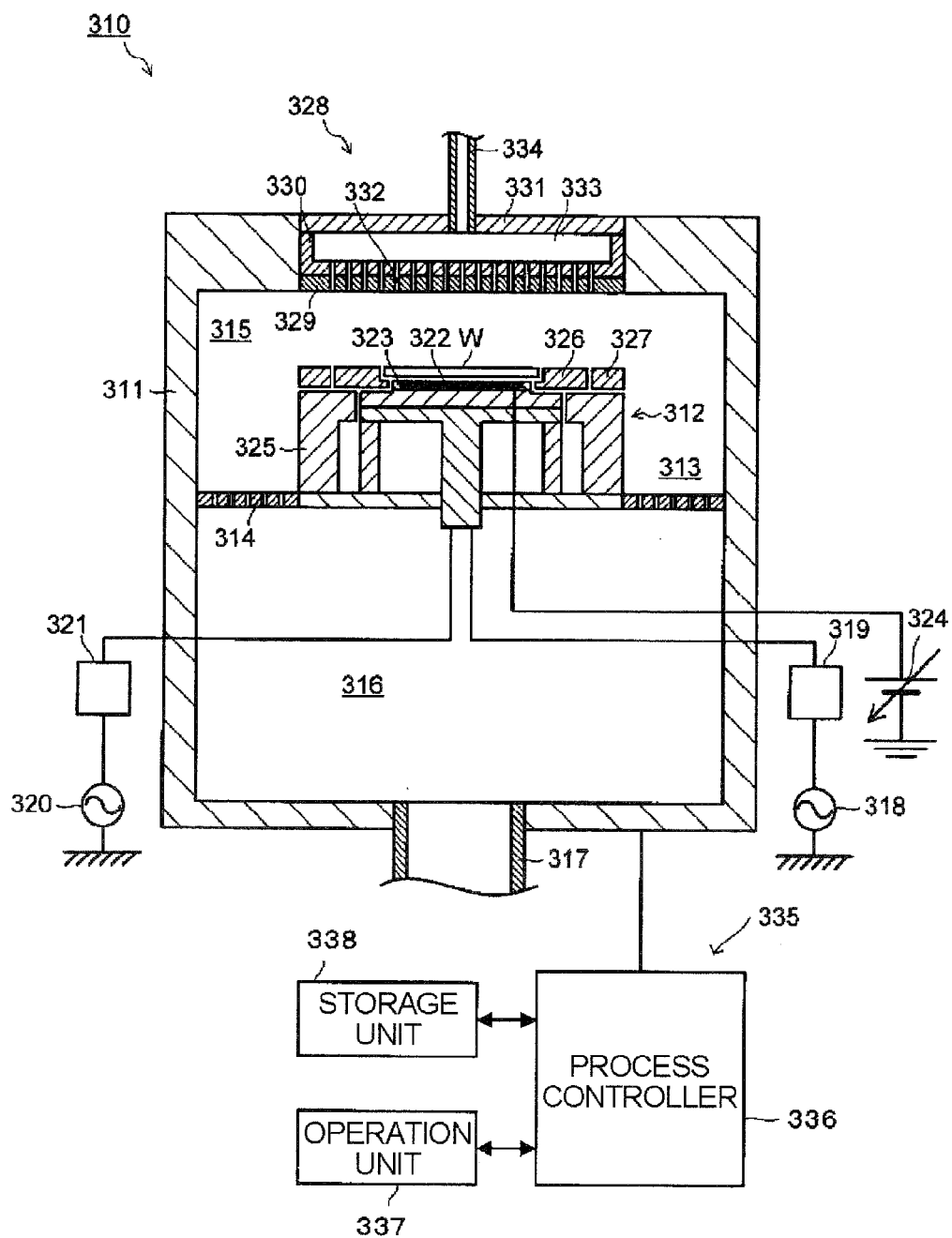
FIG. 3 is a view illustrating another exemplary configuration of a plasma etching apparatus used in the exemplary embodiment of the present disclosure.

Hereinafter, referring to FIG. 3, a configuration of a so-called capacitively coupled plasma (CCP)-type plasma etching apparatus which may be used in the present exemplary embodiment will be described. As illustrated in FIG. 3, a plasma etching apparatus 310 is provided with a processing chamber 311 which is hermetically configured and accommodates a semiconductor wafer W as a substrate. The processing chamber 311 is cylindrical, and the surface thereof is made of, for example, aluminum formed with an anodic oxide film. Within the vacuum processing chamber 311, a mounting unit 312 configured to horizontally support the semiconductor wafer W as a substrate to be processed is provided.

The mounting unit 312 has a base material made of a conductive metal, for example, aluminum, and serves as a lower electrode. A focus ring 326 made of, for example, silicon or SiC, is provided on the top of the mounting unit 312 to surround the circumference of the semiconductor wafer W mounted on the mounting unit 312. A shield ring 327 made of, for example, quartz, is provided to surround the circumference of the focus ring 326. A cylindrical side protecting member 325 made of, for example, quartz, is provided at the circumference of the mounting unit 312 to surround the mounting unit 312, and the shield ring 327 is mounted on the side protecting member 325.

A side exhaust path 313 is formed between the mounting unit 312 and the inner wall of the processing chamber 311, and an exhaust plate 314 is provided in the side exhaust path 313. The exhaust plate 314 is a plate shaped member having a plurality of through holes, and serves as a partition plate which partitions the inside of the processing chamber 311 into an upper portion and a lower portion. A space above the exhaust plate 314 forms a processing space 315 in which plasma is generated. A space below the exhaust plate 314 forms an exhaust chamber (manifold) 316. An exhaust pipe 317 configured to exhaust the inside of the processing chamber 311 is connected to the exhaust chamber 316. An exhaust mechanism (not illustrated) which includes, for example, a vacuum pump and an automatic pressure control (APC) valve is connected to the exhaust pipe 317.

A first high frequency power source 318 is connected to the mounting unit 312 through a first matching unit 319, and a second high frequency power source 320 is connected to the mounting unit 312 through a second matching unit 321. The first high frequency power source 318 is for use in generating plasma, and a high frequency power of a predetermined frequency (27 MHz or more, e.g., 100 MHz) is supplied to the mounting unit 312 from the first high frequency power source 318. The second high frequency power source 320 is for use in attracting ions (bias), and a high frequency power of a predetermined frequency (e.g., 2 MHz) which is lower than that of the first high frequency power source 318 is supplied to the mounting unit 312 from the second high frequency power source 320.

A shower head 328 serving as an upper electrode is provided above the mounting unit 312 to face the mounting unit 312 in parallel, and the shower head 328 and the mounting unit 312 are configured to serve as a pair of electrodes (an upper electrode and a lower electrode).

An electrostatic chuck 323 configured to electrostatically attract a semiconductor wafer W is provided on the top surface of the mounting unit 312. The electrostatic chuck 323 has a structure where an electrode 322 is interposed between insulators. A DC power supply 324 is connected to the electrode 322. The semiconductor wafer W may be attracted by, for example, Coulomb force when a DC voltage is applied from the DC power supply 324 to the electrode 322.

A coolant path (not illustrated) is formed within the mounting unit 312, and an appropriate coolant, for example, cooling water, is circulated in the coolant path to control the mounting unit 312 at a predetermined temperature. A backside gas supply mechanism (not illustrated) configured to supply a heat transfer gas (backside gas) such as, for example, a helium gas, to the rear surface side of the semiconductor wafer W is provided to penetrate, for example, the mounting unit 312. The semiconductor wafer W attracted and maintained by the electrostatic chuck 323 on the top surface of the mounting unit 312 may be controlled to a predetermined temperature by the coolant path and the backside gas supply mechanism.

The shower head 328 is provided in the ceiling portion of the processing chamber 311. The shower head 328 includes an upper electrode plate 329, a cooling plate 330 configured to detachably support the upper electrode plate 329, and a cover 331 configured to cover the cooling plate 330. The upper electrode plate 329 is constituted by a disk shaped member which has a plurality of gas holes 332 penetrating the upper electrode plate 329 in the thickness direction. A buffer chamber 333 is provided within the cooling plate 330, and is connected to an etching gas introducing tube 334. An etching gas supply source (not illustrated) is connected to the etching gas introducing tube 334.

The operation of the plasma etching apparatus 310 configured as described above is generally controlled by a control unit 335. The control unit 335 includes, for example, a process controller 336 provided with a CPU to control respective units of the plasma etching apparatus, an operation unit 337 which includes, for example, a keyboard or a display, and a storage unit 338.

The storage unit 338 stores recipes in which, for example, control programs (software) configured to implement various processings to be executed in the plasma etching apparatus 310 under the control of the process controller 336, or processing condition data are recorded. As required, any recipe may be called from the storage unit 338 by, for example, a command from the operation unit 337 and the process controller 336 may execute the recipe to perform the desired processing in the plasma etching apparatus 310 under the control of the process controller 336.

Specifically, under the control of the process controller 336, an etching gas supplied from the etching gas introducing tube 334 to the buffer chamber 333 is introduced into the processing space 315, the etching gas is excited by a plasma generating high frequency power applied from the first high frequency power source 318 through the mounting unit 312 to generate plasma, and the plasma acts on the semiconductor wafer W on the mounting unit 312 to perform plasma etching. Here, as required, ions in the plasma are attracted toward the semiconductor wafer W by an ion attracting (bias) high frequency power applied from the second high frequency power source 320 through the mounting unit 312.

The plasma etching may be performed on the amorphous silicon layer 102 of the semiconductor wafer W in the state illustrated in FIG. 1B using the plasma etching apparatus 310 configured as described above. Here, as described above, the plasma etching is performed by introducing an etching gas containing a $SF_6$ gas, that is, either a single $SF_6$ gas or a mixed gas of a $SF_6$ gas and a rare gas from the etching gas introducing tube 334 into the processing space 315.

In Example 2, plasma etching was performed on the amorphous silicon layers 102 of semiconductor wafers W in the state illustrated in FIG. 1B by using the CCP type plasma etching apparatus 310 as illustrated in FIG. 3. The plasma etching conditions are as follows.

Etching gas: $SF_6$ gas (single gas)=500 sccm
Pressure: 13.3 Pa (100 mTorr)
High frequency power (first/second): 600 W (100 MHz)/0
Distance between electrodes: 70 mm
Temperature (top portion/side wall portion/bottom portion): 100° C./80° C./60° C.
Rear surface side helium pressure: 1330 Pa (10 Torr)
Time: 30 sec In Example 2 in which the plasma etching was performed on the amorphous silicon layers 102 under the above described plasma etching conditions, as illustrated in FIG. 1C, it was possible to remove the amorphous silicon layers 102 without residues and damage to the silicon oxide layers 101 as an underlayer film (with a high selection ratio).

When the high frequency power among the above described plasma etching conditions was set to 100 W and 1200 W, and other etching conditions were the same as those in Example 2, it was possible to remove the amorphous silicon layers 102 with a high selection ratio as in Example 2. That is, in the CCP type plasma etching apparatus, the high frequency power ranging from at least 100 W to 1200 W may be used.

In Comparative Example 1, plasma etching was performed on amorphous silicon layers 102 of semiconductor wafers W in the state illustrated in FIG. 1B by using the CCP type plasma etching apparatus under the following plasma etching conditions.

Figure 4A:
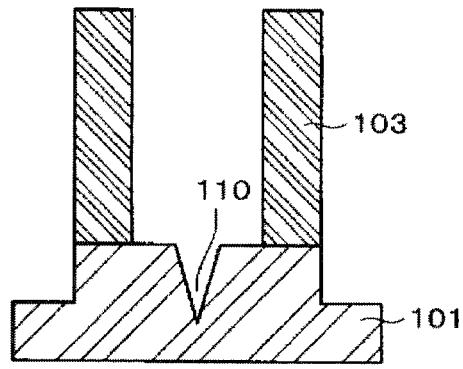
FIGS. 4A and 4B are views schematically illustrating an etched state of Comparative Examples.

Etching gas: $Cl_2$ gas (single gas)=600 sccm
Pressure: 13.3 Pa (100 mTorr)
High frequency power (first/second): 1200 W/0
Distance between electrodes: 70 mm
Temperature (top portion/side wall portion/bottom portion): 100° C./80° C./60° C.
Rear surface side helium pressure: 1330 Pa (10 Torr)
Time: 60 sec In Comparative Example 1, it was possible to completely remove the amorphous silicon layers 102, but the selection ratio was low, and, thus, the silicon oxide layer 101 as an underlayer was scraped off, causing a loss 110, as illustrated in FIG. 4A.

In Comparative Example 2, plasma etching was performed on amorphous silicon layers 102 of semiconductor wafers W in the state illustrated in FIG. 1B by using the CCP type plasma etching apparatus under the following plasma etching conditions.

Etching gas: $HBr/O_2$=600/5 sccm
Pressure: 3.325 Pa (25 mTorr)
High frequency power (first/second): 200 W/150 W
Distance between electrodes: 70 mm Temperature (top portion/side wall portion/bottom portion): 100° C./80° C./40° C.

Rear surface side helium pressure: 1330 Pa (10 Torr)

Time: 60 sec

Figure 4B:
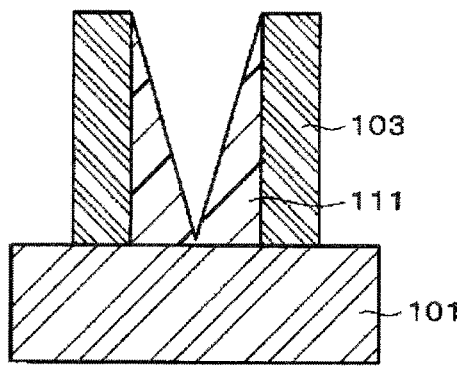

Comparative Example 2 was in an etching condition of a high selection ratio, but the amorphous silicon layers 102 were not completely removed, and residues 111 were left between the silicon oxide layers 103, as illustrated in FIG. 4B.

The present disclosure has been described with reference to exemplary embodiments and Examples, but is not limited thereto, and various modifications may be made.

The present disclosure may be used in a field of, for example, manufacturing a semiconductor device, and thus has industrial applicability.

DESCRIPTION OF SYMBOLS

101: silicon oxide layer (base layer)
102: amorphous silicon layer
103: silicon oxide layer
110: loss
111: residues.

What is claimed is:

1. A method of manufacturing a semiconductor device, the method comprising:
   forming a patterned silicon-containing layer on a substrate using a mask;
   forming a silicon nitride layer or a silicon oxide layer to cover an entire portion of the patterned silicon-containing layer formed on the substrate;
   selectively removing the silicon nitride layer or the silicon oxide layer such that the silicon nitride layer or the silicon oxide layer remains on the side wall portion of the patterned silicon-containing layer and a top surface of the silicon-containing layer is exposed; and
   after the selectively removing the silicon nitride layer or the silicon oxide layer, selectively removing the silicon-containing layer through plasma etching so that the silicon nitride layer or the silicon oxide layer formed on the side wall portion is left forming a pattern of the silicon nitride layer or the silicon oxide layer having a narrower pitch than the patterned silicon-containing layer,
   wherein the plasma etching is performed using an inductively coupled plasma having a high frequency power of 200 W or more and an etching gas containing a $SF_6$ gas in both the selectively removing the silicon nitride layer or the silicon oxide layer and the selectively removing the silicon-containing layer.

2. The method of claim 1, wherein the etching gas is a single $SF_6$ gas or a mixed gas of a $SF_6$ gas and a rare gas.

3. The method of claim 2, wherein the rare gas is helium or argon.

4. The method of claim 1, wherein the silicon-containing layer is any one of an amorphous silicon layer and a polysilicon layer.

5. The method of claim 1, wherein the plasma etching is performed using an ICP-type plasma etching apparatus in which an inductive coupling coil is disposed outside a processing chamber and the etching gas is supplied into the processing chamber at a flow rate in a range of 300 sccm to 500 sccm.

6. The method of claim 1, wherein the plasma etching is performed using an ICP-type plasma etching apparatus in which an inductive coupling coil is disposed outside a processing chamber and a temperature of the substrate is set to 60° C. or less to perform the plasma etching.

7. The method of claim 1, wherein the patterned silicon-containing layer has a thickness ranging from 10 nm to 50 nm.

8. The method of claim 1, wherein the silicon nitride layer or a silicon oxide layer is formed by atomic layer deposition (ALD) with a thickness ranges from 10 nm to 20 nm.

9. A method of manufacturing a semiconductor device, the method comprising:
   forming a patterned silicon-containing layer on a substrate using a mask;
   forming a silicon nitride layer or a silicon oxide layer to cover an entire portion of the patterned silicon-containing layer formed on the substrate;
   selectively removing the silicon nitride layer or the silicon oxide layer such that the silicon nitride layer or the silicon oxide layer remains on the side wall portion of the patterned silicon-containing layer and a top surface of the silicon-containing layer is exposed;
   after the selectively removing the silicon nitride layer or the silicon oxide layer, selectively removing the silicon-containing layer through plasma etching so that the silicon nitride layer or the silicon oxide layer formed on the side wall portion is left thereby forming a pattern of the silicon nitride layer or the silicon oxide layer having a narrower pitch than the patterned silicon-containing layer,
   wherein the plasma etching is performed using a capacitively coupled plasma having a plasma generating high frequency power in a range of 100 W to 1200 W in both the selectively removing the silicon nitride layer or the silicon oxide layer and the selectively removing the silicon-containing layer.

10. The method of claim 9, wherein the patterned silicon-containing layer has a thickness ranging from 10 nm to 50 nm.

11. The method of claim 9, wherein the silicon nitride layer or a silicon oxide layer is formed by atomic layer deposition (ALD) with a thickness ranges from 10 nm to 20 nm.

* * * * *